(12) United States Patent
Cowgill et al.

(10) Patent No.: US 7,507,099 B2
(45) Date of Patent: Mar. 24, 2009

(54) FLOATING INTERFACE LINKAGE

(75) Inventors: Bruce L. Cowgill, Newbury Park, CA (US); Keith J. Breinlinger, Pleasanton, CA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/175,809

(22) Filed: Jul. 5, 2005

(65) Prior Publication Data

US 2006/0073723 A1    Apr. 6, 2006

Related U.S. Application Data

(60) Provisional application No. 60/615,035, filed on Oct. 1, 2004.

(51) Int. Cl.
*H01R 13/64* (2006.01)
(52) U.S. Cl. ..................................................... 439/248
(58) Field of Classification Search ......... 439/246–248, 439/252, 382, 384, 385
See application file for complete search history.

(56) References Cited

U.S. PATENT DOCUMENTS

| | | | |
|---|---|---|---|
| 1,587,120 A * | 6/1926 | Haddock | 439/382 |
| 1,687,718 A * | 10/1928 | Falbe et al. | 439/384 |
| 4,911,648 A * | 3/1990 | Yajima et al. | 439/159 |
| 5,554,041 A * | 9/1996 | Lallement | 439/248 |
| 5,769,652 A | 6/1998 | Wider et al. | |
| 6,060,891 A | 5/2000 | Hembree et al. | |
| 6,377,062 B1 | 4/2002 | Ramos et al. | |
| 6,670,818 B1 | 12/2003 | Hembree | |
| 6,734,688 B1 | 5/2004 | Castellano et al. | |
| 2003/0077932 A1 | 4/2003 | Lewinnek | |

* cited by examiner

*Primary Examiner*—Felix O Figueroa
(74) *Attorney, Agent, or Firm*—Christopher R. Balzam, Esq.

(57) ABSTRACT

In at least one embodiment, an interface assembly is provided which is capable of connecting with a receptor. The interface assembly includes a connector, a base, and a linkage set between the connector and base. The linkage can include a spring assembly and a cable assembly. The connector is capable of connecting with the receptor to form electrical connections, fluid connections or other such connections. The spring assembly is a deformable member that is attached to the base and to the connector, such that the connector is capable of moving in six degrees of freedom. The cable assembly is attached to the base and the connector. The cable assembly is capable of limiting motion and positioning of the connector in at least one degree of freedom. As such, the cable assembly can set the connector at an initial position or within an initial region.

45 Claims, 7 Drawing Sheets

FLOATING INTERFACE LINKAGE

This application claims the benefit of U.S. Provisional Application No.: 60/615,035, filed on Oct. 1, 2004.

BACKGROUND

Test platforms or other automated test equipment (ATE), provide for individual testing of semiconductor devices during production. Depending on the equipment, test platforms can include two main components, a test head and a peripheral. At the interface between the test head and the peripheral lies a device interface board, or DIB. A manipulator physically positions the test head in alignment with the peripheral and causes the test head and peripheral to mechanically dock.

Test platforms generally convey electrical signals between the test head and the DIB using blind-mate connectors. A blind-mate connector typically includes a connection arrangement in which two parts of a connector can be mated by virtue of their positioning and alignment. Blind-mate connectors are often used in modular electronic systems, in areas that are enclosed or inaccessible. Coarse alignment mechanisms, such as tabs, have been used for aligning the DIB with the test head.

However, due to increasing pin densities and pin numbers, manufacturers are increasingly designing test heads with smaller and more closely spaced connectors. As a result, the coarse alignment mechanisms can not adequately provide desired alignments of the connectors. As such, a need exists for a device to compensate for misalignments, such that closely spaced connectors or pins can make accurate and repeated connections.

SUMMARY

In at least one embodiment an interface assembly including a linkage, a connector, and a base. The linkage in turn has a biasing member and a non-rigid limiter. Both the biasing member and the non-rigid limiter couple the base and the connector and are capable of applying forces therebetween. The coupling of the base and the connector can be done by the biasing member and the non-rigid limiter, in either a direct or indirect manner. The non-rigid limiter and the biasing member are separate from one another. The non-rigid limiter can be capable of limiting motion of the connector in at least one degree of freedom. In other embodiments, the non-rigid limiter is capable of limiting motion of the connector in any of up to six degrees of freedom.

In at least one other embodiment, an interface assembly has a connector, a base, and a linkage. The linkage includes a biasing member and a non-rigid limiter, which are mounted between the base and the connector. The non-rigid limiter is separate from the biasing member, and is positioned lateral to the biasing member. The biasing member can be positioned about the non-rigid limiter or the non-rigid limiter can be positioned about the biasing member. The biasing member and the non-rigid limiter can be positioned adjacent one another. In other embodiments, the biasing member has at least two deformable members opposingly mounted about the connector. In such embodiments, the non-rigid limiter includes members positioned lateral to the deformable members.

Other embodiments have an interface assembly which includes a connector having an initial position, a base, a restorative member mounted between the base and the connector, and a positioning member mounted between the base and the connector. Upon displacement of the connector from the initial position, the restorative member exerts a biasing force to urge the connector back towards the initial position. The positioning member is capable of limiting motion of the connector in at least one degree of freedom.

With these embodiments, the positioning member can be non-rigid. The positioning member can be a cable, a chain, a beam with a tension limiter, a slider with a position limiter and/or a telescoping assembly. The restorative member can be a spring, a flexure, a deformable structure and/or a mass. The positioning member can be capable of limiting motion of the connector in at least one degree of freedom and up to six degrees of freedom. The connector can have a deformable member, or members, with a connector spring constant or effective spring constant. The restorative member, or members, can have a restorative member spring constant or effective spring constant. In some embodiments, the connector spring constant is equal to or greater than the restorative member spring constant. The connector can include one or more electrical connectors, fluid connectors, heat transfer connectors, optical connectors, structural connectors, mass transport connectors, and/or the like. The connector can be an array of electrical connectors such as spring pins.

In another embodiment, a test platform includes an interface assembly capable of mating with a peripheral to form a series of signal channels. The interface assembly includes a connector capable of connecting with the peripheral, a base, a spring assembly which couples the base and the connector, and a cable assembly positioned between the base and the connector. The spring assembly is deformable, such that the connector is capable of motion in six degrees of freedom relative to the base. Depending on the embodiment, the cable assembly is capable of limiting motion of the connector in at least one degree of freedom and up to six degrees of freedom. With the cable assembly having one cable, the motion of the connector can be limited in at least one degree of freedom. With two cables, the motion of the connector can be limited in at least two degrees of freedom. With three cables, the motion of the connector can be limited in at least three degrees of freedom. With four cables, the motion of the connector can be limited in at least four degrees of freedom. With five cables, the motion of the connector can be limited in five degrees of freedom. With six cables, the motion of the connector can be limited in six degrees of freedom.

BRIEF DESCRIPTION OF THE DRAWINGS

The features and advantages of the present invention will be better understood with regard to the following description, appended claims, and accompanying drawings where:

DESCRIPTION

Figure 1A:
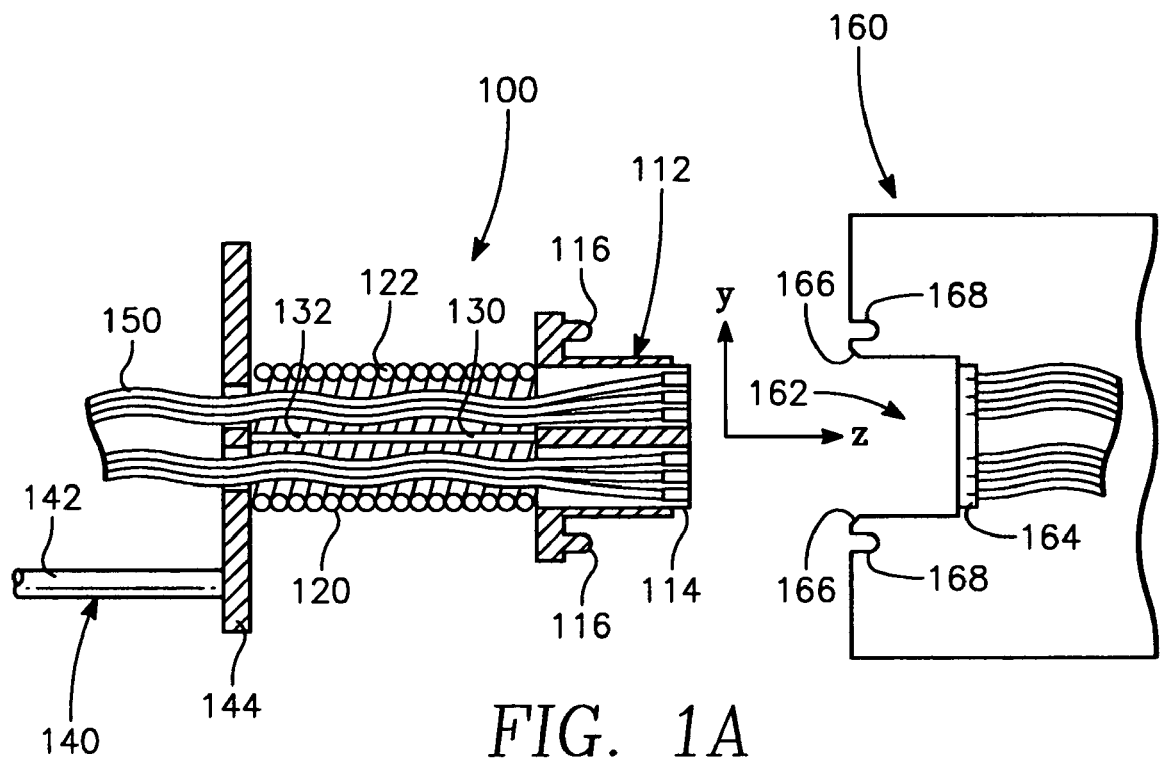
FIGS. 1A and B show cross-section side views of an interface assembly and receptor in accordance with at least one embodiment of the present invention.

This application claims the benefit of U.S. Provisional Application No.: 60/615,035, filed on Oct. 1, 2004. The U.S. Provisional Application No.: 60/615,035, filed on Oct. 1, 2004, entitled: FLOATING INTERFACE LINKAGE, by Breinlinger, et al., is hereby incorporated herein by reference in its entirety.

One or more of the embodiments set forth herein may have one or more of the advantages set forth herein. Also, there may be other advantages that become evident upon reading of this description.

One embodiment of the present invention includes an interface assembly having a linkage which provides a connector that is free floating or semi-floating, self-centering and self-aligning. This allows the interface assembly to be used in applications where automated and repeated connections are performed. Such automated and repeated connections can include not only machine performed operations, i.e. robotics, where there is no active human participation, but also where the connections are inaccessible, i.e. blind-mate connections, as well as combinations thereof.

The floating capability of certain embodiments of the invention allows for movement to compensate for any misalignment between the interface assembly and any receptor which the interface assembly is received into. That is, as the interface assembly and a receptor mate, any misalignment between the two structures can be corrected for without any disruption or damage to either structure. The floating capability allows the interface assembly to move generally independently and freely from the structure or device that it is mounted to. Floating allows the interface assembly to be six degree of freedom compliant. This also allows the interface assembly to be used with receptors having a wide range of positioning relative to the initial or centered position of the interface assembly. This can result in reduced tolerances needed for the fabrication of the receptors and the interface assembly.

While certain embodiments are capable of floating, also provided is an interface assembly which has repeatable and accurate self-positioning. The interface assembly is capable of self-centering and aligning, such that the interface assembly can be repeatably positioned back to a given location, or within a certain region, over repeated cycles of displacement.

In some embodiments, this location or region is the initial position of the interface assembly. After the interface assembly has been displaced from its initial position, by being connected with a receptor or for any other reason, the self-positioning capability of the interface assembly will move the interface assembly back to its initial position. The self-positioning allows the interface assembly to be used in operations that are repeated and require a certain common set of conditions for each cycle of the operation.

Some embodiments also provide an interface assembly that has accurate self-positioning. That is after the displacement, the interface assembly can reposition itself to within a relativity narrow region of positions. By having accurate self-positioning less compensation for misalignments is needed in the configuration of the interface assembly and/or the receptor. As such, the interface assembly is able to employ smaller points of connection, i.e. conducting pads, and/or smaller guiding and alignment structures, i.e. receptor funnels. With the amount of potential misalignment reduced by the accuracy of the self-positioning aspect of the interface assembly, the size of the connection and guiding structures can be reduced, saving space and allowing for increased density of connection points, interface assemblies and receptors.

Increasing the density of the connection points and structures allows for a reduction in the overall space used for a given number of connections, or a greater number of connections for a given space. This increased density is important in applications such as test platforms, because as DUTs have become increasing more complex, the number of signal channels, and therefore connections, have continued to increase. This can result in a reduction, or at least a limitation, in the overall size of the test platform, saving valuable space on the floor of the clean room. Accurate positioning of the interface assembly also allows for longer equipment life and greater equipment versatility.

Figure 8:
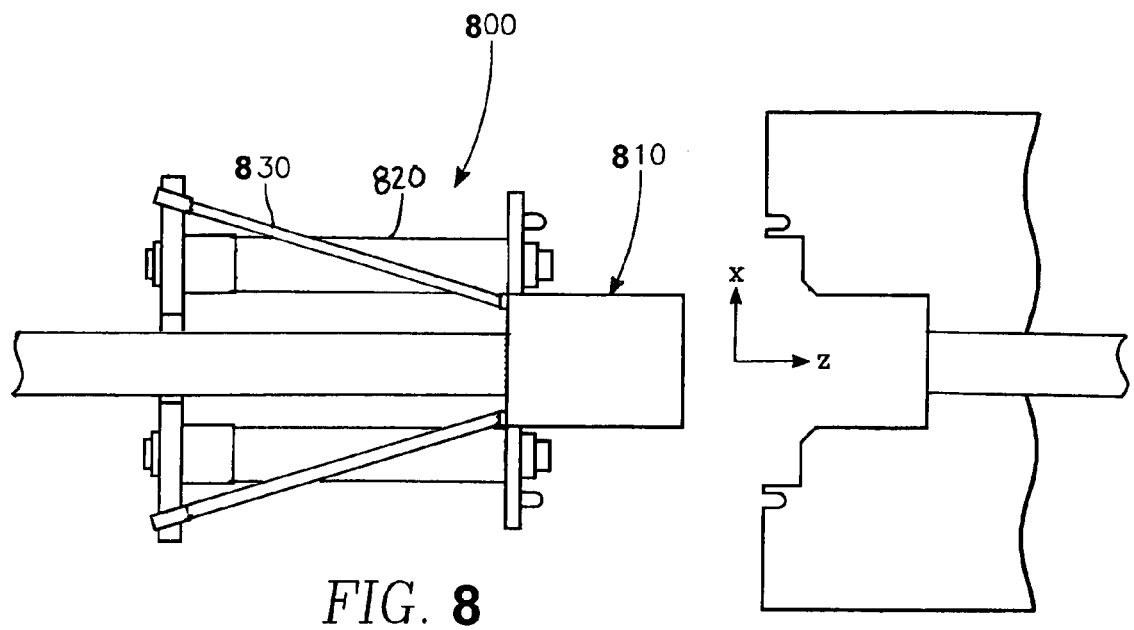
FIG. 8 shows a side view illustrating a simplified block diagram of one possible embodiment.

The type of connections which can be made by the linkage can vary. As shown herein by simplified block diagram illustration in FIG. 8, in some embodiments 800, the connectors 810 are electrical and in others they are optical, fluid, gas, or the like. Likewise, the applications of the linkages can be any of many varieties, including for example, microchip and semiconductor test equipment, electric or alternative fuel car recharging, docking of spacecraft, and the like.

A specific application for certain embodiments of the present invention is in a test head assembly of a test platform. An example of an test platform with a test head is set forth in U.S. Pat. No. 6,734,688, application Ser. No. 571,563, entitled LOW COMPLIANCE TESTER INTERFACE, by Castellano, et al., filed May 15, 2000, issued May 11, 2004, which is hereby incorporated by reference in its entirety. Another example of an test platform with a test head and a blind-mate interface is set forth in U.S. Patent Application Publication Number 20030077932, application Ser. No. 10/047,513, entitled FLOATING BLIND MATE INTERFACE FOR AUTOMATIC TEST SYSTEM, by Lewinnek, filed Oct. 22, 2001, published Apr. 24, 2003, which is hereby incorporated by reference in its entirety.

A test platform typically includes a test head, which has a set of test instruments, and a separate peripheral, which contains the device to be tested, or DUT. The test head is populated by a series of instrument boards, which typically slide into the test head with a set of connectors extending out from each card of the test head. The peripheral normally includes a DIB to interface between the DUT and the test head. Before the testing begins the test head and the peripheral are connected together to establish a connection between the DUT and the test channels. To facilitate this connection, some embodiments can be used to form a link or connection between a card in the test head and the DIB. This connection can be made in an automated or blind-mate manner over repeated cycles of operation. An example of such a test platform is the UltraFlex test system manufactured by Teradyne, Inc. of Boston Mass.

Independent of its application, the interface assembly of some embodiments of the present invention allows a direct connection to be made between the device that the interface assembly is mounted to and the receptor. That is, an additional connection or interface between the interface assembly and the device that it is mounted to is not necessary. This direct connection reduces or eliminates losses that are typically associated with having an additional interface. Also, having a direct connection reduces the costs associated with having additional interfaces, which lowers the overall cost of the assembly. In semiconductor tester applications the direct connection reduces losses from impedance discontinuities, reduces timing errors and also lowers costs.

Some embodiments of the present invention are shown in the FIGS. 1-6. The embodiments shown include restorative member components and positioning member components. The restorative members provide a restorative force that is capable of urging the interface assembly back to its initial position. The restorative members can be biasing members such as the springs and spring assemblies shown in FIGS. 1-6. In other embodiments, the restorative member can be a part or a structure that is positioned such that the influence of an external force (such as that due to gravity, or other acceleration, acting on the mass of the component), functions as a biasing member to return the interface assembly back towards its initial position. The positioning members provide a structure to define the position and/or restrain the motion of the interface assembly. The positioning members can be a limiter, a non-rigid limiter, or devices such as the cables shown in FIGS. 1-6. The restorative members and the positioning members can couple the connector to the base.

Figure 1B:
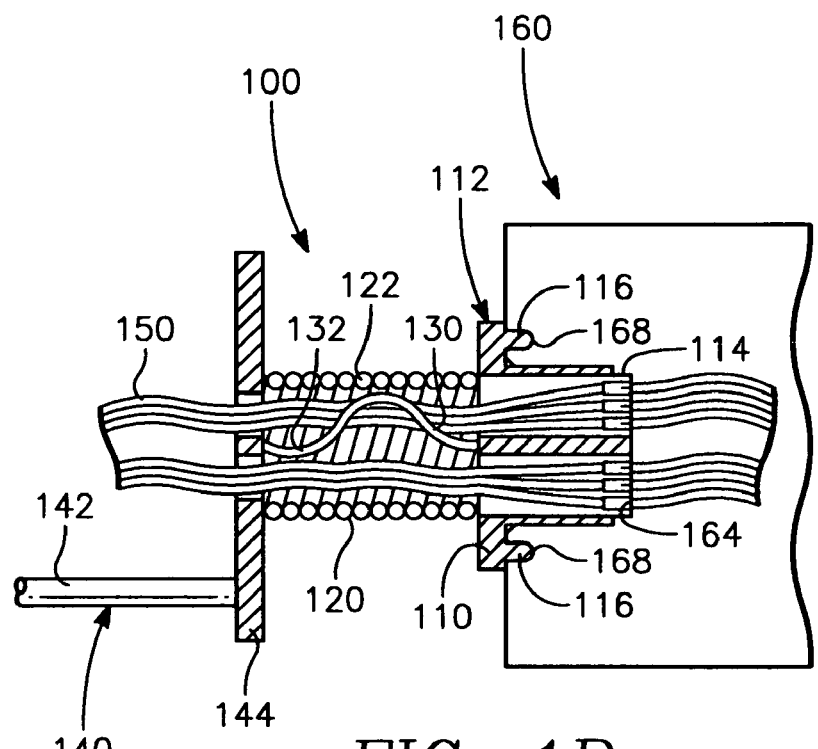

FIGS. 1A-B show an embodiment of the present invention of a interface assembly 100 which has an connector head 110, a restorative member or assembly 120, a positioning member or assembly 130, a base 140 and communication lines 150. The connector head 110 is attached or coupled to the restorative assembly 120, and the positioning assembly 130, which are both mounted or coupled to the base 140. Together the restorative assembly 120, and the positioning assembly 130 form a linkage. The restorative assembly 120 is positioned laterally to the positioning assembly 130. The connector head 110 allows the interface assembly 100 to link or connect with a separate device or structure. The restorative assembly 120 is flexible and/or deformable to allow the connector head 110 to be displaced from its initial position, such as the position shown in FIG. 1A. As the connector head 110 is moved from its initial position, the restorative assembly 120 provides a force to urge the connector head 110 back towards its initial position. The positioning assembly 130 is capable of exerting a force upon, or otherwise limiting the motion of, the connector head 110. This allows the positioning assembly 130 to set the initial position of the connector head 110, and depending on the embodiment, potentially control and/or limit the motion of the connector head 110 out of its initial position. The communication lines 150 are attached to the connector head 110 and run back towards the base 140 to connect with another device (not shown).

The connector head 110 includes a frame 112, a connector 114 and can include guide or alignment pins 116. In the embodiment shown, connector head 110 is capable of being received by a receptor 160, as shown in FIG. 1B, or another structure or device (not shown). The frame 112 mounts to the restorative assembly 120 and the positioning assembly 130, and provides a platform for the connector 114. In the embodiment shown, the frame 112 defines an opening therethrough (not shown) to allow the communication lines 150 to pass through and connect with the connector 114. This allows the communication lines 150 to form a direct connection with the connector 114, eliminating the need for an additional interface with the interface assembly 100.

The connector 114 can be any of a variety of embodiments including a set of electrical conducting pads or pins, male connectors, female connectors, fluid connectors, heat transfer connectors, or the like. The connectors should allow for blind-mate connections to be made to a matching set of components in the receptor 160 or other structure. The connector 114 can be sprung such that it provides a force to urge the connections together and allow for displacement of the connectors. In such embodiments, the connector 114 can have a spring constant, $k_i$, which can have a constant or a variable value.

As shown, the guide pins 116 are positioned about the frame 112 and orientated to be capable of being received by the receptor 160. The guide pins 116 are arranged such that they guide the connector head 110 into position within the receptor 160 or other structure. In some embodiments, the connector head 110 does not include the guide pins 116.

In the embodiment shown in FIGS. 1A and B, the restorative assembly 120 is a spring structure 122, such as a coil spring. The spring 122 is capable of providing a restorative force upon the connector head 110 as the connector head 110 is displaced, to urge it back towards an initial position. For example, as shown in FIG. 1B, as the interface assembly 100 comes into contact with the receptor 160, the connector head 110 is displaced from its initial position towards the base 140, deforming the spring 122. As the spring 122 is compressed, the force applied by the spring 122 onto the connector head 110 is increased. Then, as the interface assembly 100 is moved back away from the receptor 160, the force exerted by the spring 122 on the connector head 110, will cause the connector head 110 to return towards its initial position. The spring 122 can have a spring constant, $k_s$, which can have a constant or variable value, depending on the embodiment.

In certain embodiments the spring constant, $k_s$, of the spring 122 is much lower than the spring constant, $k_i$, of the connector 114. This allows the connector 114 to be a low compliance connector, which can aid in obtaining good connections between the connector 114 and the receptor 160. Also, with a lower spring constant for the spring 122, much more displacement will occur with the spring 122 than with the connector 114, as the interface assembly 100 is compressed after contact with the receptor 160. This allows the interface assembly to compensate for any manufacturing tolerances which exist in the system, while still allowing the use of a low compliance connector, which, due to its short overall height, can have good high speed electrical performance.

The ratio of the spring constant of the connector to the spring constant of the restorative or spring assembly can vary depending on the particular embodiment. Typically this value is greater than 1, and in some embodiments, within a range of about 1:1 to about 10,000:1. In other embodiments, this ratio is within the ranges of about 5:1 to about 300:1, of about 5:1 to about 100:1, and of about 10:1 to about 50:1. As described in detailed herein, in at least one embodiment, the ratio of the spring constant of the connector to the spring constant of the restorative or spring assembly is about 26:1. As such, in such embodiments, the springs of the restorative assembly will be displaced 26 times the amount of the displacement of the connector for the application of a given force to the interface assembly.

In other embodiments, the restorative assembly 120 is a structure other than a spring, such as a flexure or other deformable structure. Also, embodiments can include more than a single spring as that shown in FIGS. 1A-B. The restorative assembly 120 can also include a preload that is applied to the connector head 110, such that a certain amount of force must be applied to the connector head 110 prior to any displacement thereof.

The positioning assembly 130 in the embodiment shown, is a cable 132 which positions the connector head 110 at, or about, its initial position. The cable 132 positions the connector head 110 in one degree of freedom, such as along the z-axis, as shown. As the interface assembly 100 is received by the receptor 160, or another receiving structure or device, the cable 132 loses its influence on the position of the connector head 110. That is, the cable 132 becomes slack, thus allowing connector head 110 to move in towards the base 140. Then, when the interface assembly 100 disengages the receptor 160, the cable 132 again limits movement of the connector head 110 and positions it at, or about, connector head's initial position. The cable 132 can also be used to allow the application of a preload on the spring 122, as the cable 132 can carry the load applied by the preload.

In some embodiments, the positioning assembly 130 is a beam, or other substantially non-deformable structure or series of structures. Such embodiments can include a slider, pivot, telescoping structure, and/or similar device, to allow the positioning assembly 130 to limit motion of the connector head 110 in one degree of freedom. The device also should have its motion limiting influence on the connector head 110 be reduced, or eliminated, as the connector head 110 is moved from its initial position. Examples of such embodiments can include a series of telescoping tubes, a chain linkage, a beam capable of passing through the base 140, and the like, as illustrated by block 830 in one embodiment 800, shown in FIG. 8.

The positioning assembly 130 can also include an adjuster (not shown), which allows the length and/or the tension of the positioning assembly 130 to be adjusted. By adjusting the length of the positioning assembly 130 the initial position of the connector head 110 can be set. The adjuster can be any of a variety of structures including a screw, a turn buckle, a clamp, a set screw, a slider and/or the like.

The base 140 mounts both the restorative assembly 120 and the positioning assembly 130. The base 140 can include a card 142 and a mount 144. The card 142 can be an instrument card which can be positioned within a device such as a test head. Of course, any of a number of a variety of different embodiments of the shape and arrangement of the base 140, other than those shown in FIGS. 1A-B, can be used.

The communication lines 150 are connected through the connector head 110 and to the connector 114. The communication lines 150 allow the interface assembly 100 to be compressed without limiting, or at least without substantially limiting, the motion of the interface assembly 100. The communication lines 150 can be any of a variety of different embodiments, including electrical cables, coaxial cables, wires, hoses, tubes, or the like. Of course, the particular type of communication line 150 will depend on the type of connection provided by the connector 114. The routing of the communication lines 150 can vary depending on the specific embodiment. In some embodiments, such as that shown in FIG. 1A-B, the communication lines 150 are routed through the spring 122 and adjacent to the cable 132. However, the communication lines can also be positioned external to the spring 122 and/or away from the cable 132, positioned to approach the connector head 110 from one or more sides of the structure, or such that the lines 150 are separated to individual lines of different paths, and not grouped as shown in the figure. In other embodiments, the communication lines can be integrated with, or attached to, the cables 132.

As shown in FIG. 1B, the receptor 160 is capable of receiving the connector head 110 in an opening defined in the receptor (FIG. 1A—opening 162). The receptor 160 also includes a connector 164 which is capable of establishing connections with the connector 114. The connector 164 can be any of a variety of embodiments including a set of electrical conducting pads or pins, male connectors, female connectors, fluid connector, or the like. The connector 164 allows for blind-mate connections to be made to a matching set of components in the connector 114.

Figure 2:
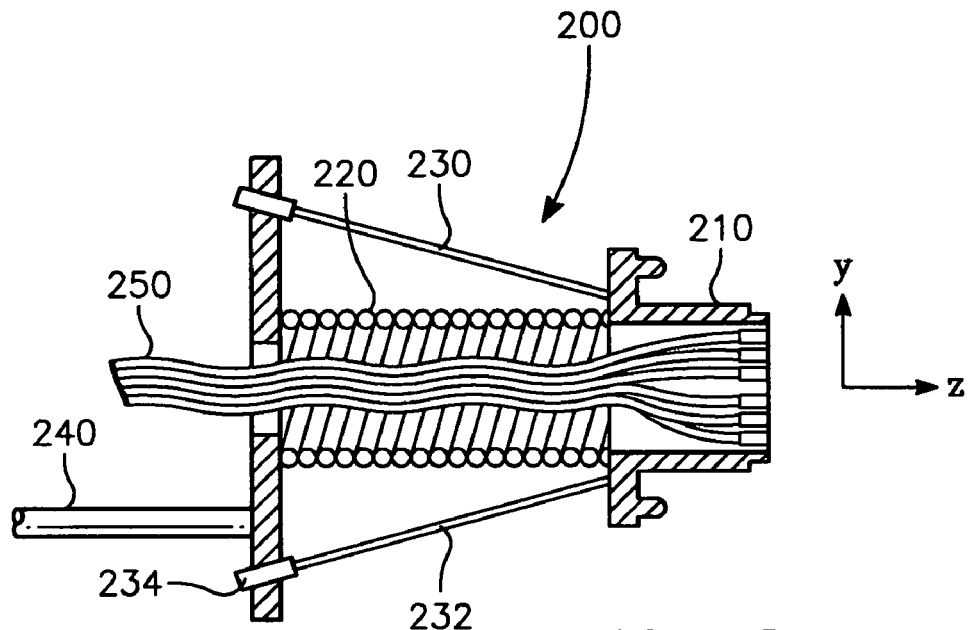
FIG. 2 shows a cross-section side view of an interface assembly in accordance with at least one embodiment of the present invention.

Another embodiment of the interface assembly 200 is shown in FIG. 2. The interface assembly 200 includes a connector head 210, a restorative member or assembly 220, a positioning member or assembly 230, a base 240 and communication lines 250. As can be seen, with the exception of the positioning assembly 230, the other components of the interface assembly 200 are the same or similar to those of the interface assembly 100, shown in FIGS. 1A and B.

With the embodiments shown in FIG. 2, the positioning assembly 230 can control the positioning of the connector head 210 in two degrees of freedom. This is in contrast to the positioning assembly 130 of the interface assembly 100, which as described herein, can control the positioning of the connector head 110 in a single degree of freedom. As can be seen in FIG. 2, by adjusting the positioning assembly 230, the connector head 210 can be positioned in a direction along the z-axis and rotated in a direction about the x-axis (not shown—the x-axis is perpendicular to the z-axis and the y-axis). This allows greater control in setting the initial position of the connector head 210, which can further facilitate establishing connections between the interface assembly 200 and a receiving structure or device (not shown).

In the embodiments shown, the positioning assembly 230 includes two cables 232 positioned between the base 240 and the connector head 210. By varying the length of the two cables 232 the position of the connector head 210 can be controlled. For example, by changing the lengths of both the cables 232 by about the same amount in the same direction, i.e. both shortened or lengthened, the position of the connector head 210 can be varied in a direction along the z-axis. Alternatively, by adjusting the length of the cables 232 differentially, shortening one and lengthening the other, the connector head 210 can be pitched or rotated about the x-axis.

Depending on the embodiment, the cables 232 can be positioned so there are aligned or parallel to one another, i.e. along the z-axis direction, or they can, as shown, be arranged in an angled, offset or non-parallel manner. Having the cables 232 positioned in a parallel manner allows the cables 232 to apply a force component to the connector head 210 in a direction along the z-axis. However, having the cables 232 positioned in an offset manner allows the application of components of the forces to be applied both along the direction of the z-axis, and lateral to the direction of the z-axis. Such lateral force components can not only act to stabilize, by urging the connector head 210 towards an initial position, but also be used to position the connector head 210. The particular angle or angles of the cables will depend on the requirements of the embodiment including the amount of restorative and positioning forces desired as well as the arrangement of the cables and components of the interface assembly.

The positioning assembly 230 can also include adjusters 234 which allow the length and/or the tension of the positioning assembly 230 to be adjusted. By adjusting the length of the positioning assembly 230, the initial position of the connector head 210 can be set. The adjuster 234 can be any of a variety of structures including a screw, a turn buckle, a clamp, a set screw, a slider and/or the like.

As with the positioning assembly 130, the positioning assembly 230 can be any of a variety of different structures other than cables.

Figure 3:
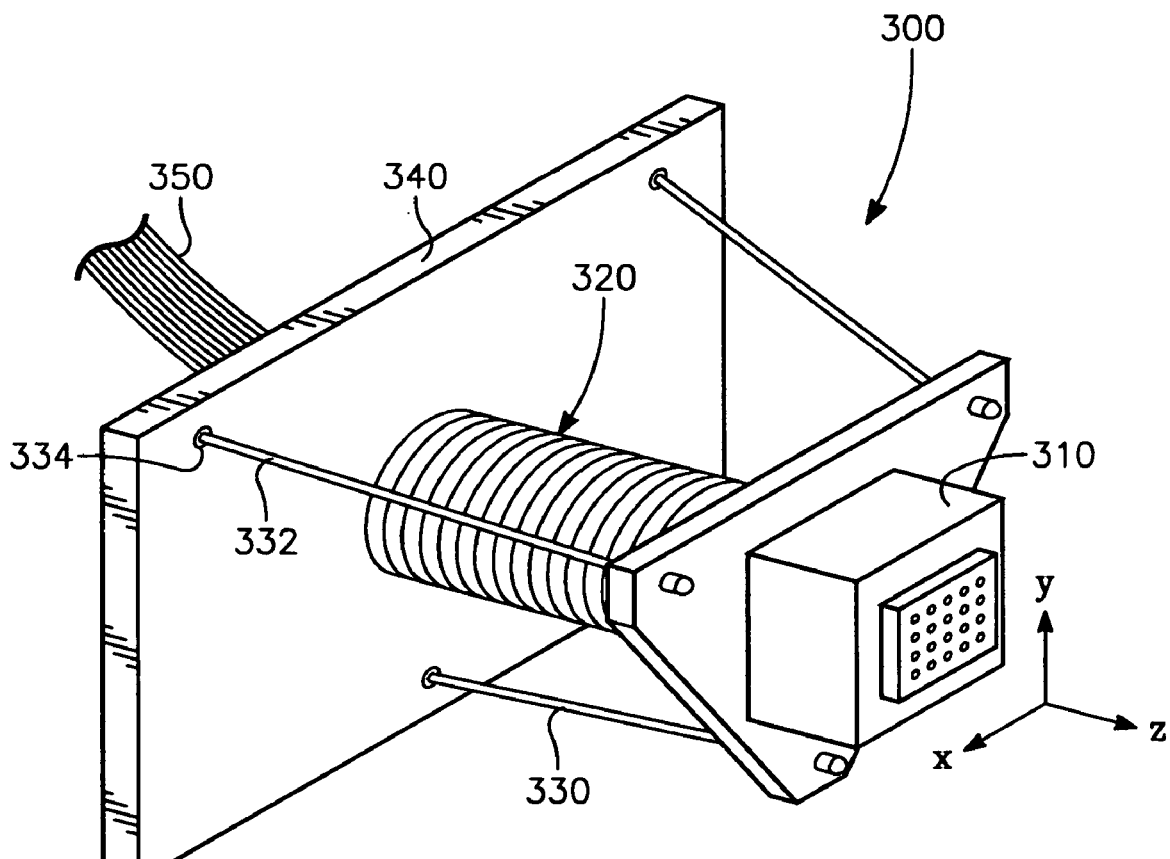
FIG. 3 shows a perspective view of an interface assembly in accordance with at least one embodiment of the present invention.

Another embodiment is shown in FIG. 3. The interface assembly 300 includes a connector head 310, a restorative member or assembly 320, a positioning member or assembly 330, a base 340 and communication lines 350. Except for the positioning assembly 330, the other components of the interface assembly 300 are the same, or similar, to those of the interface assembly 100, shown in FIGS. 1A and B.

With the embodiments shown in FIG. 3, the positioning assembly 330 is capable of positioning the connector head 310 in three degrees of freedom. The positioning assembly 330 includes three cables 332 set between the base 340 and the connector head 310. By varying the length of each of the three cables 332, the position of the connector head 310 can be controlled.

Depending on the embodiment, the cables 332 can be positioned so they are aligned or parallel to one another, alternatively one or more of the cables can, as shown, be arranged in an offset or non-parallel manner. Having the cables 332 positioned in an offset manner allows the application of components of the forces to be applied both along the direction of the z-axis, and lateral to the direction of the z-axis. Such lateral force components can act to stabilize, by urging the connector head 310 towards an initial position, and also be used to position the connector head 310.

The positioning assembly 330 can also include adjusters 334, which allow the length and/or the tension of the positioning assembly 330 to be adjusted. By adjusting the length of the positioning assembly 330, the initial position of the connector head 310 can be set in three degrees of freedom. The adjusters 330 can be any of a variety of structures including a screw, a turn buckle, a clamp, a set screw, a slider and/or the like.

As with the positioning assembly 130, the positioning assembly 330 can be any of a variety of different structures other than cables.

Figure 4:
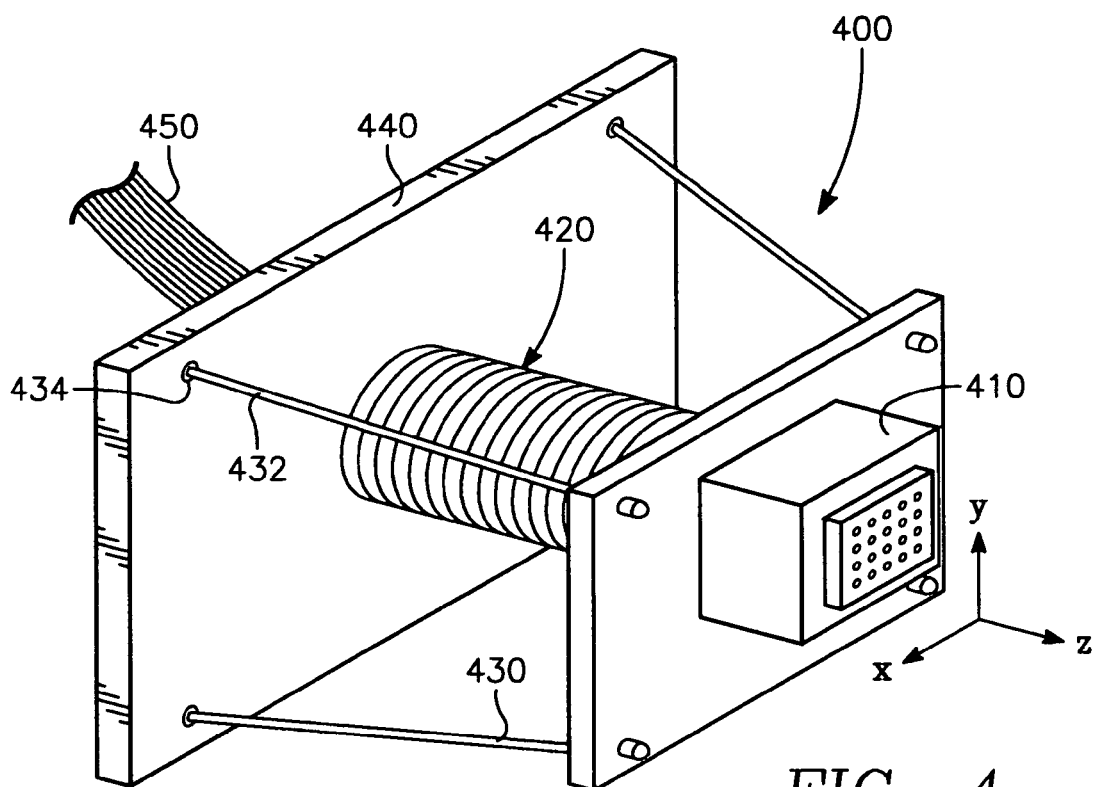
FIG. 4 shows a perspective view of an interface assembly in accordance with at least one embodiment of the present invention.

Another embodiment of the interface assembly 400 is shown in FIG. 4. The interface assembly 400 includes a connector head 410, a restorative member or assembly 420, a positioning member or assembly 430, a base 440 and communication lines 450. Again, except the positioning assembly 430, the other components of the interface assembly 400 are the same, or similar, to those of the interface assembly 100, shown in FIGS. 1A and B.

With the embodiments shown in FIG. 4, the positioning assembly 430 is capable of positioning the connector head 410 in four degrees of freedom. The positioning assembly 430 includes four cables 432 set between the base 440 and the connector head 410. By varying the length of each of the four cables 432, the position of the connector head 410 can be controlled.

Depending on the embodiment, the cables 432 can be positioned so they are aligned or parallel to one another, or they can, as shown, be arranged in an offset or non-parallel manner. Having the cables 432 positioned in an offset manner allows the application of components of the forces to be applied along both the direction of the z-axis, and lateral to the direction of the z-axis. Such lateral force components can not only act to stabilize, by urging the connector head 410 towards an initial position, but also be used to position the connector head 410.

The positioning assembly 430 can also include adjusters 434, which allow the length and/or the tension of the positioning assembly 430 to be adjusted. By adjusting the length of the positioning assembly 430, the initial position of the connector head 410 can be set in four degrees of freedom. The adjusters 430 can be any of a variety of structures including a screw, a turn buckle, a clamp, a set screw, a slider and/or the like.

As with the positioning assembly 130, the positioning assembly 430 can be any of a variety of different structures other than cables.

Figure 5:
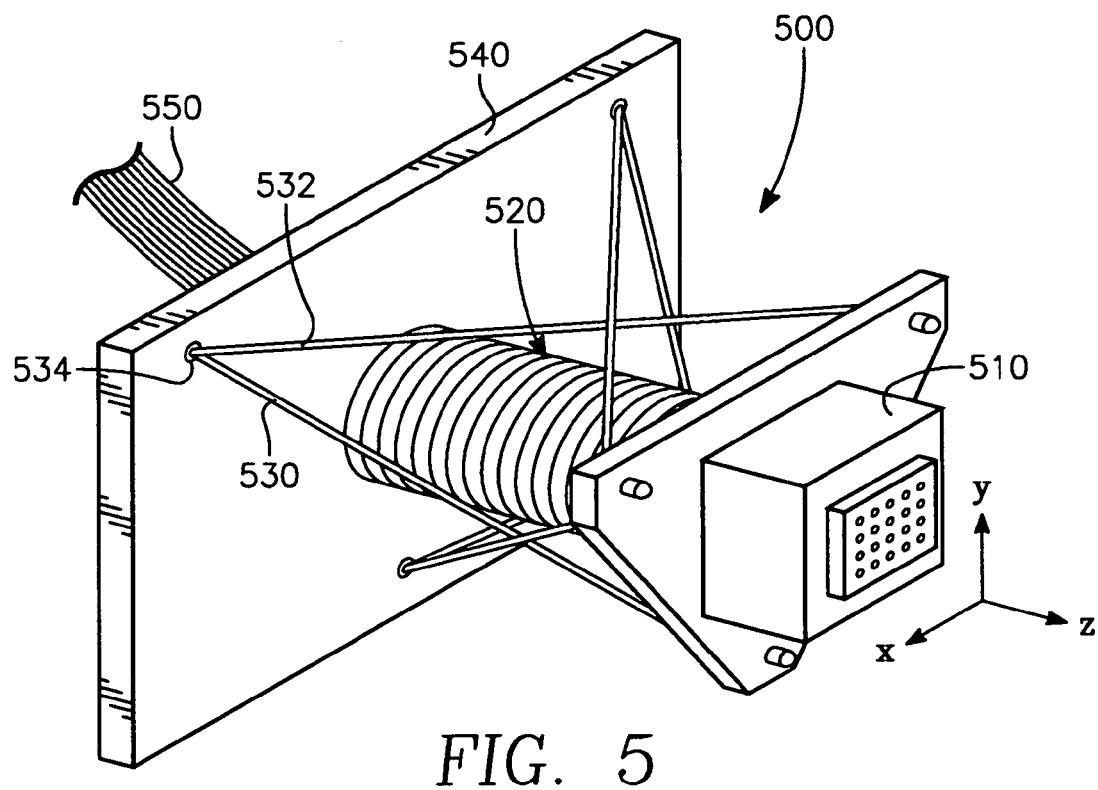
FIG. 5 shows a perspective view of an interface assembly in accordance with at least one embodiment of the present invention.

FIG. 5 shows another embodiment of the interface assembly 500. The interface assembly 500 includes a connector head 510, a restorative member or assembly 520, a positioning member or assembly 530, a base 540 and communication lines 550. Again, except for the positioning assembly 530, the other components of the interface assembly 500 are the same, or similar, to those of the interface assembly 100, shown in FIGS. 1A and B.

With the embodiments shown in FIG. 5, the positioning assembly 530 is capable of positioning the connector head 510 in six degrees of freedom. The positioning assembly 530 includes six cables 532 set between the base 540 and the connector head 510. This arrangement of the cables 532 is similar to the layout employed by a Stewart Platform and/or a hexapod, except that in a Stewart Platform a set of actuators are positioned at the locations of the cables 532 which are capable of moving the platform. In a somewhat similar fashion in the present invention, varying the length of each of the six cables 532 causes the position of the connector head 510 to be changed (controlled) in all directions.

As shown, the cables 532 can be arranged in an offset or angled manner, which allows the application forces in each axis and about each axis. This also can be used to stabilize the connector head 510 by urging the connector head 510 towards an initial position.

The positioning assembly 530 can also include adjusters 534, which allow the length and/or the tension of the positioning assembly 530 to be adjusted. By adjusting the length of the positioning assembly 530, the initial position of the connector head 510 can be set in all six degrees of freedom. The adjusters 530 can be any of a variety of structures including a screw, a turn buckle, a clamp, a set screw, a slider and/or the like.

As with the positioning assembly 130, the positioning assembly 250 can be any of a variety of different structures other than cables.

Certain embodiments of the present invention can limit motion and set the position of the connector head in five degrees of freedom. Such embodiments can have five adjustable cables (or other structures) positioned between the base and the connector. For example, embodiments of a five degree of freedom assembly can be obtained by either removing one of the cables 532 shown in FIG. 5, or adding a cable 432 in FIG. 4. Of course, a numerous other arrangements for a five degree of freedom system are possible.

FIGS. 6A-E show several views of a floating interface assembly 600 in accordance with at least one embodiment of the present invention. As shown, the interface assembly 600 includes a connector head 610, restorative member or spring assemblies 620, positioning member or cable assemblies 630, an instrument card 640 and communication lines 650.

Figure 6A:
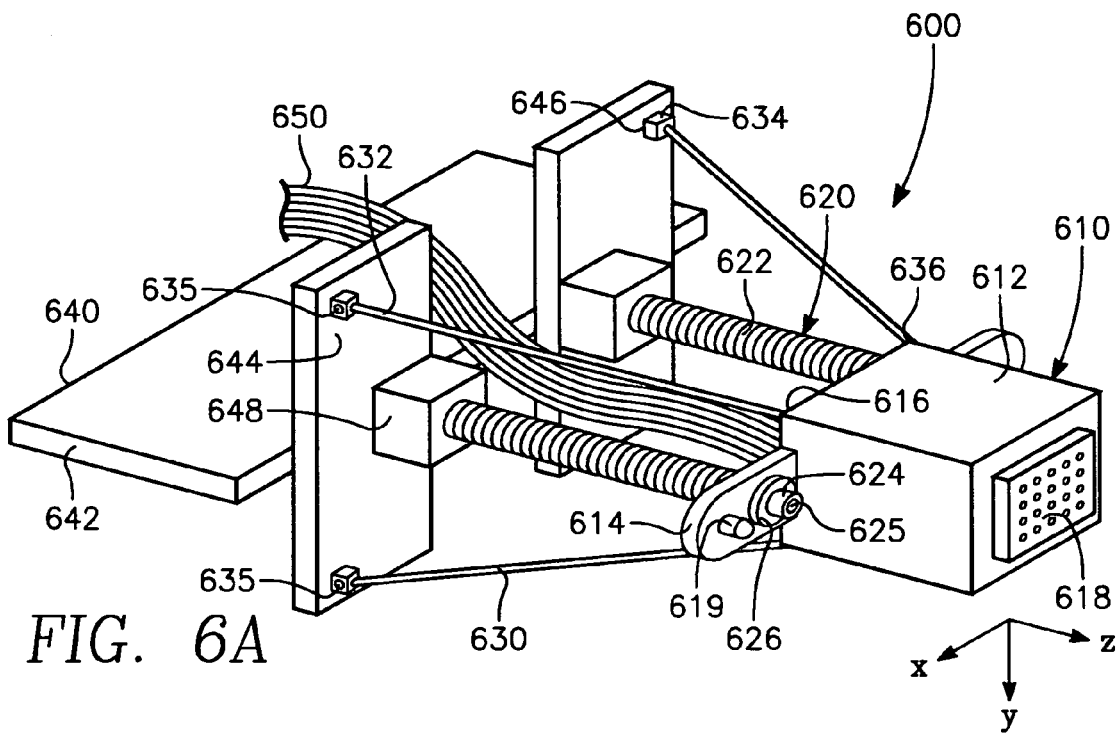
FIG. 6A shows a perspective view of an interface assembly in accordance with at least one embodiment of the present invention.
Figure 6B:
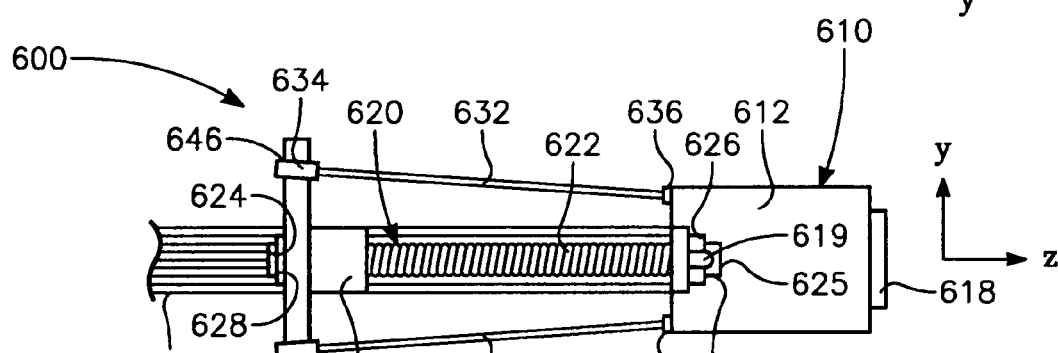
FIG. 6B shows a side view of an interface assembly in accordance with at least one embodiment of the present invention.
Figure 6C:
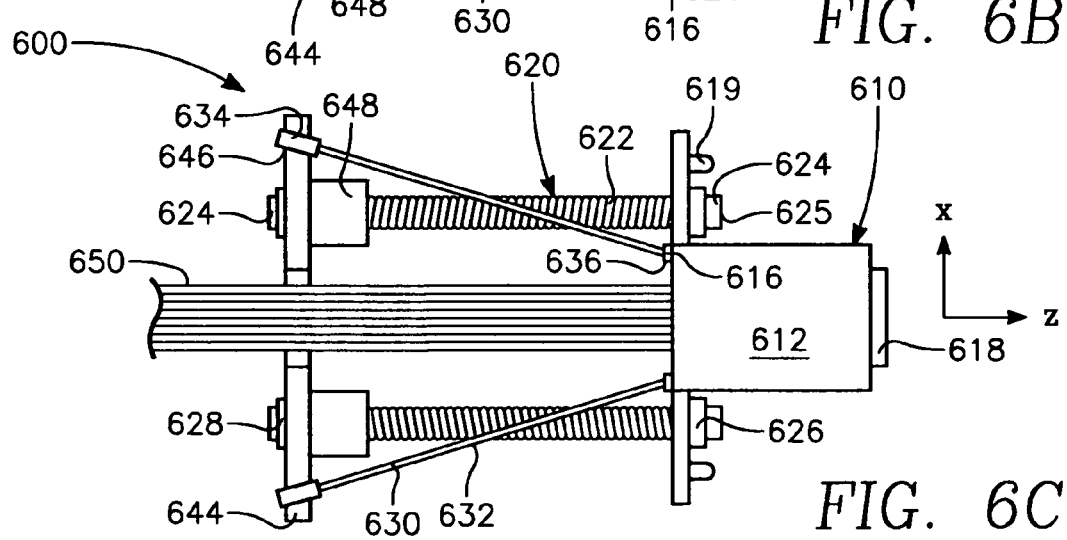
FIG. 6C shows a top view of an interface assembly in accordance with at least one embodiment of the present invention.
Figure 6D:
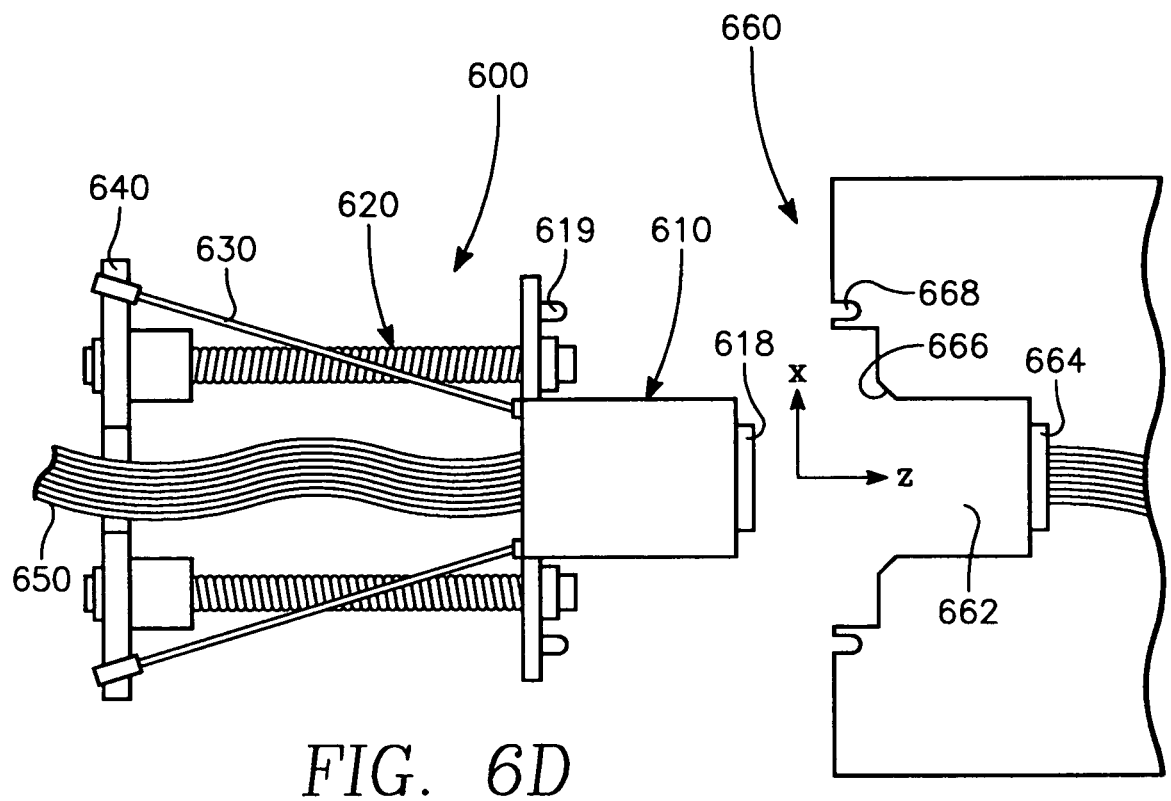
FIGS. 6D and E show top views of an interface assembly and receptor in accordance with at least one embodiment of the present invention.
Figure 6E:
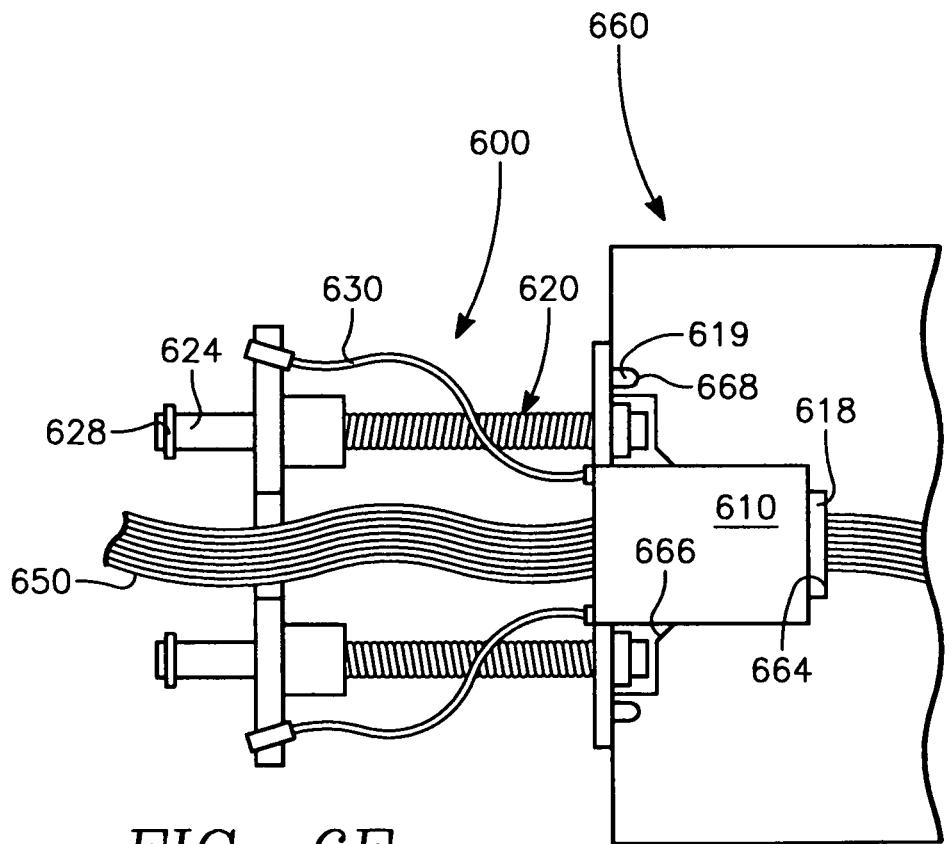

The interface assembly 600 is positioned at the end of an instrument card 640 of the test head (not shown) and provides a connection or interface between the instrument card 640 and the peripheral of the tester (not shown). In some embodiments, the interface assembly 600 is capable of contacting the device interface board, DIB or funnel 660, as shown in FIGS. 6D-E. At the area of contact the interface assembly 600 can have a series of conductive pads or pins (not shown) that contact similar pads or pins on the DIB 660 to form a set of channels between the test head and the device under test or DUT (not shown). In this manner, signals can be sent between the test head and the DUT to allow testing and analysis of the DUT to occur.

As the interface assembly 600 comes into contact with the DIB 670, and after contact with the DIB 670, the interface assembly 600 can be compressed along its length (generally along the z-axis shown), as shown in FIG. 6E. This compression is accomplished, at least in part, by the deformation of the spring assemblies 620. By providing a force that urges the interface assembly 600 against the DIB 660, the compression aids in the establishment of the electrical connections therebetween.

In addition to providing a force to facilitate making the electrical contacts, the interface assembly 600 also provides precision positioning so that the pads or points of the interface assembly 600 and of the DIB 660 will align and contact each other. With the connector head 610 attached to the instrument card 640 by the spring assemblies 620 and the cable assemblies 630, the connector head 610 can move independently of the instrument card 640. This connection allows the connector head 610 to float and be self-centering. The connector head 610 can move relative to the instrument board 640 in all directions, including moving along and rotating about the x, y and z axes. That is, the connector head 610 is compliant in six-degrees of freedom.

As described in detail herein, the connector head 610 can be positioned relative to the instrument card 640 by adjusting the cable assemblies 630. As such, the interface assembly 600 provides an interface that has a wide range of motion and flexibility, is self-centering, and which has an adjustable initial position.

In the embodiment shown, the connector head 610 not only provides the interface to the particular device that the interface assembly 600 contacts, but also aids in the positioning of the interface assembly 600. The connector head 610 can be any of a variety of other configurations than that shown, depending on the particular embodiment. The connector head 610 includes a frame 612, spring mounts 614, cable mounts 616, and a connector 618.

The frame 612 is configured for mounting of the spring assemblies 620 at the spring mounts 614 and the cable assemblies 630 at the cable mounts 616 at one end of the frame 612, and the connector 618 at an opposite end of the frame 612. That is, the frame 612 can have a length, positioned generally along the z-axis, which positions the connector 618 out away from, or in front of, the spring mounts 614 and the cable mounts 616.

As shown, in FIG. 6D, the length of the frame 612 facilitates positioning of the connector head 610 when received by a structure such as the DIB 660. The frame 612 can also be shaped to facilitate the receiving and the positioning of the connector head 610. The embodiment shown has a generally square shape, or cross-section along the z-axis, which is received by the squared shaped opening 662 of the interface block 660. The opening 662 can include a funnel 666 that is shaped to aid in the receiving and positioning of the frame 612. By being of a square shape, the frame 612 can be guided by the interface block 660 in a variety of directions including limiting or preventing rotation about the z-axis and movement along the x and y axes.

Of course, a variety of different lengths and shapes of the frame 612 can be employed depending on the particular embodiment. For example, the frame 612 could have a variable and/or tapered cross-section shaped to be received by a variable and/or tapered funnel.

As shown in FIGS. 6A-E, the frame 612 can also include a hollow portion for receiving and guiding the communication lines 650 through the frame 612 and to the connector 618. This allows a direct connection to be made between the connector 618 and the instrument card 640, eliminating the need for one or more additional connections between the connector 618 and the card 640. As noted herein, reducing the number of connections can increase the quality of the signal by reducing signal losses and impedance discontinuities caused by such connections. The hollow portion of the frame 612 also acts to prevent movement of the lines 650 at the connection with the connector 618, therefore reducing or eliminating damage and/or wear on the lines 650.

Depending on the embodiment, the communication lines 650 can also be positioned to approach the connector 118 from one or more sides of the apparatus, or such that the lines 650 are separated to individual lines of different paths, and not grouped as shown in the figure.

The frame 612 can be of a variety of different materials including a metal, such as aluminum or stainless steel, a plastic, or a combination thereof.

The spring mounts 614 are sized and shaped to receive the spring assemblies 620. The spring mounts 614 can include an opening (not shown) positioned about a portion of the spring assembly 620. In some embodiments, the opening can allow movement of the connector head 610 along the z-axis by compression or expansion of the spring assemblies 620. The opening of the mount 614, can be sized either larger than the portion of the spring assembly passing through it, as detailed below, and/or have a curved interior shape to allow rotation of the frame 612 relative to the spring assemblies 620, and/or to allow differential positioning of the spring assemblies relative to the frame 612. That is, by providing some play between the opening and the spring assembly 620, the frame 612 can be angled about the x-axis and the y-axis at or about the spring mounts 614.

In other embodiments, the spring mounts 614 prevent movement of the frame 612 relative to the spring assemblies 620, or are arranged to allow only either, rotation about, or translation along a given axis. In such embodiments, to maintain the ability of the interface assembly 600 to be movable in a variety of directions, the movement, or movements, that are restricted at the spring mounts 614 are otherwise provided for at a separate location along the spring assemblies, as further detailed herein.

The spring mounts 614 can be positioned at various points about the frame 612 depending on the shape of the frame 612 and the desired response and movement of the connector head 610. Further, the spring mounts 614 can have configurations other than those shown. In some embodiments the spring mounts can further include one or more alignment pins 619, and/or receivers for alignment pins (not shown), for guiding and positioning the interface assembly 600 into a receiving structure, such as the DIB 660.

The cable mounts 616 allow the attachment of the cable assemblies 630 to the frame 612, so that the connector head 610 can be positioned by the cable assemblies 630. The cable mounts 616 can be any of a variety of different fasteners including a hole through the frame 612, a catch, a loop, a hook, a weld, a solder point, an adhesive point, a screw, a bolt and/or the like. The cable mounts 616 can be positioned on the connector head 610, the cable assembly 630, or with a portion on both.

In some embodiments, the cable mounts 616 can include an adjustment means or device (not shown) for setting the tension on, and/or the length of, the cable of the cable assembly 630. This adjustment means can be any of a variety of configurations including a screw, a turnbuckle, a clamp, a set screw, a slider and/or the like. As with the cable mount 616, the adjustment means can be positioned on either or both of the connector head 610, and the cable assembly 630. The adjustment means can be the same or similar to the adjustment means positioned at the mounting of the cable assembly 630 to the instrument card 640, as described herein. While shown generally at the rear corners of frame 612, depending on the embodiment, the positions of the cable mounts 616 can vary around the frame 612 and/or along its length.

On the end of the connector head is the connector 618. The connector 618 is positioned to contact a device for testing. In some embodiments the device contacted by the connector 618 is the DIB 660, as shown in FIGS. 6D-E. The connector 618 can be any of a variety of different components. Typically, the connector 618 has a set of contact pads or points, that are arranged to be capable of contacting a corresponding set of pads or points positioned on the DIB 660. This allows a set of separate electrical connections to be established between the connector 618 and the DIB 660. That is, several signal channels can be formed between the test head and the device under test or DUT, to facilitate testing of the DUT. In certain embodiments the connector has one or more heat transfer pads or surfaces (not shown), which are arranged to contact one or more components (not shown) on the DIB 660, for cooling or heating the components.

To make sure that the contact pads or points of the connector 618 remain in contact with those of the DIB 660, the connector 618 can also include a biasing means to urge the contact pads or points towards or against the DIB 660. As in other embodiments discussed herein, shown in FIG. 8 as reference number 820, this biasing means is a restorative member which can include springs, deformed members, flexures, gas spring, air spring, air piston, damper, hydraulic apparatus, weighted structures (mass, weight, or load), and/or the like. The biasing means can be one or several elements that apply a force to all the contact pads or points together, in sets or individually. With springs, deformed members, flexures and such structures, a spring constant for each biasing element is present. With a set of biasing elements, an effective spring constant can be determined for the connector 618.

As described herein, in some embodiments of the present invention, the effective spring constant of the connector 618 is much greater than the effective spring constant of the spring assemblies 620. This allows the connector 618 to be a low compliance connector, which can aid in obtaining good connections between the pads or pins of the connector 618 and those of the DIB 660. Also, with a low effective spring constant of the spring assemblies 620, much more displacement will occur with the spring assemblies 620 than with the connector 618, as the interface assembly 600 is compressed after contact with the DIB 660. This allows the interface assembly 600 to take up much of any existing manufacturing tolerances in the entire system, while still allowing the use of a low compliance connector, which, due to its short overall height, has good high speed electrical performance.

Depending on the embodiment, the connector 618 might have poor impedance properties (relative to the communication lines) due to factors such as a lack of shielding. However, the effect of the poor impedance properties of the connector 618 can be reduced or minimized by a short overall height. Having a short overall height reduces timing mismatches and reduces any adverse effect on the signal passing through the interface assembly, especially at high speeds. That is, since the electrical length of the interposer is short with respect to the wavelength of the signals carried by the communication lines, the effect of the poor impedance properties of the connector 618 is reduced.

The connector 618 can be a variety of different devices including any device functioning as an interposer between the interface assembly 600 and the DIB 660, or other receiving structure. For embodiments where the connector 618 is capable of making electrical connections, the interposer can be a double-sided electrical connector which includes an array of spring pins or probes for making electrical connections between conducting pads on the frame 612 and those on the DIB 660. The connector 618 can be a short stroke interposer to limit the impedance incontinuities and increase the performance of the device. Such double-sided electrical connectors are commercially available from a variety of manufacturers and resellers, including: Synergetix of Kansas City, Kans., U.S.A. (a division of Inter Connect Devices, Inc.); Rika Denshi America of Attleboro, Mass., U.S.A.; Everett Charles Technologies of Pomona, Calif., U.S.A.; and Intercon Systems of Harrisburg, Pa, U.S.A..

In some embodiments the connector 618 includes a plurality, series or array of pins. Each of these pins can be capable of exerting a force within a range of about 5 grams to about 70 grams.

In other embodiments of the present invention, the connector 618 can be configured for making other than electrical connections. For example, the connector 618 can include one or more fluid connectors for making fluid connections with another device. Such embodiments could be used in a variety of applications such as automated filling stations, or the like.

The spring assemblies 620 are positioned between the connector head 610 and the instrument card 640. The spring assemblies 620 provide a force against the connector head 610 to urge it towards an initial position upon displacement of the connector head 610 from the initial position. That is, the spring assemblies 620 operate to aid in maintaining the connector head 610 in an initial or self-centered position. The operation of spring assemblies 620 allows for accurate and repeatable positioning of the connector head 610 over a series of displacements of the connector head 610.

While the spring assemblies 620 can be of any of a variety of different configurations, at least one embodiment is shown in FIGS. 6A-E. The spring assembly 620 can operate by having a variable length and being positionable, allowing the connector head 610 to move relative to the instrument card 640. The spring assembly 620 can be compressed from an initial position to allow the connector head 610 to move towards the instrument card 640 generally along the direction of the z-axis. Also, in certain embodiments, the spring assemblies can be moved about one or both of its mounts to allow additional movement of the connector head 610 in directions such as pitch and yaw.

As the spring assembly 620 is compressed, it generates a force against both the connector head 610 and the instrument card 640 to urge the connector head 610 back towards its initial position. With the connector head 610 in contact with a structure, such as the DIB 660, the force exerted by the spring assembly 620 will urge the connector 618 of the connector head 610 against the DIB 660. This application of force can facilitate connections being made between the connector 618 and the DIB 660.

The spring assembly 620 can have a variable amount of preload, requiring a certain amount of force to be applied to the spring assembly 620 before any displacement thereof occurs. In some embodiments the amount of preload is adjustable, as further described herein.

Each spring assembly 620 has a spring constant, $k_{spring\ assembly}$. One or more spring assemblies 620, such as the two shown, will have a combined or effective spring constant, $k_{effective\ spring\ assembly}$.

The spring constants of the spring assemblies 620 typically have a constant, or at least substantially constant, value. That is, the force exerted by the spring assembly 620 has a generally linear relationship to the displacement of the spring assembly 620. Certain embodiments have spring assemblies that apply a constant force regardless of the travel or compression of the spring assembly. In other embodiments, the spring constant is variable, such that there is a non-linear relationship between force and displacement.

As noted herein, to enable the use of a low compliance connector 618, the effective spring constant of the spring assemblies 620 can be set much lower than the effective spring constant of the connector 618. In such embodiments, the travel of the spring assemblies 620 will be much greater then that of the connector 618 for the application of a given force, which is greater than any preload of the spring assembly, to the interface assembly 600.

The effective spring constant, $k_{effective\ connector}$, of the connector 618 is a function of the spring constants, $k_{pin}$, of the each pin of the connector 618.

The values of the spring constants of the spring assembly 620 and the connector 618, as well as the ratio of the values, can be any of a wide range of values depending on the particular application. For example, in one embodiment, the effective spring constant of the spring assembly, $k_{effective\ spring\ assembly}$ is 36 lbf/in, the spring constants of each pin of the connector, $k_{pin}$, is 3.26 lbf/in, for an effective connector spring constant, $k_{effective\ connector}$, of 939 lbf/in. As such, in this example, the ratio between $k_{effective\ connector}$ and $k_{effective\ spring\ assembly}$ is 26:1. For a given application of force to the interface assembly 600 of this example, the springs of the spring assemblies 620 will be displaced 26 times more than the displacement of the low compliance connector 618. In certain embodiments of the interface assembly 600, the ratio between $k_{effective\ connector}$ and $k_{effective\ spring\ assembly}$ is within the range of 5:1 to 300:1. Of course, other ranges of the ratio are possible depending on the embodiment.

As shown in FIGS. 6A-E, in at least one embodiment, the spring assemblies 620 can include a spring 622, a spring rod 624, a first rod fastener 626 and a second rod fastener 628. The spring 622 is positioned about the spring rod 624 and between the spring mount 614 and a spring mount 648 on the instrument card 640. The spring rod 624 passes through the opening in the spring mount 614 and the opening in the spring mount 648, and is secured in place by the first rod fastener 626 and the second rod fastener 628, respectfully. In at least one embodiment, as the interface assembly 600 is compressed, the mount 614 moves along the spring rod 624 compressing the spring 622 as it moves.

The spring 622 can be any of a variety of different configurations including, as shown, a coil spring. Other embodiments of the spring 622, or other devices positioned between the mounts, can include a flexure, a deformable member, a gas spring, an air spring, an air piston, a damper, a hydraulic member, or a device having an active control of an air or hydraulic member. The spring assemblies 620 can also include dampers and/or adjustment means for controlling the preload and the length of the spring 622 and spring assembly 620. The spring 622 can be of any of a number of different materials, including a metal such as aluminum or stainless steel, or a plastic. In other embodiments the spring assembly 620 can have more that one spring 622 of different sizes and/or shapes. In such cases the spring constant can be variable as the characteristics of the spring 622 can vary as it is compressed. For example, by placing springs of different lengths and different spring constants coaxially around the spring rod 624, then a variable effective spring constant will be obtained as each spring is engaged as the spring assembly 620 is compressed.

Depending on the embodiment, the spring rod 624 can be received between the spring mount 614 and the spring mount 648 in several different ways. Also, the spring rod 624 can be either a single structure or have more than one section.

In some embodiments, the spring rod 624 can be fixed at either the spring mount 614 or the spring mount 648, with the opposing mount being free for movement of the spring rod 624. In other embodiments, the spring rod 624 can be free to move at both the spring mount 614 and the spring mount 648, within the limits set by the first rod fastener 626 and the second rod fastener 628. Depending on the arrangement of the mounts, movement at either, or both, of the mounts can be restricted in one or more directions. That is, the mounts can be configured to not only allow movement in the direction of the z-axis of the spring rod 624, but also laterally thereto, in pitch, about the x-axis, and/or in yaw, about the y-axis. Such freedom of movement of the spring assembly 620 at either one, or both, of the mounts allows the connector head 610 to move independently of the instrument card 640 in those directions.

For embodiments where the spring rod 624 is mounted to either the spring mount 614 or the spring mount 648 in a fixed manner, any of a variety of mounts can be used. Such mounts can include an interference fit, welding, solder, fasteners, an adhesive, a screw mount, a pin or the like. A free mount for the spring rod 624 can be achieved by many different approaches including providing a gap between the opening of the spring mount 614 and/or the opening of the spring mount 648, and the spring rod 624. Also, these openings can be shaped to allow pitching and/or yawing of the spring rod 624 within the openings.

Figure 6F:
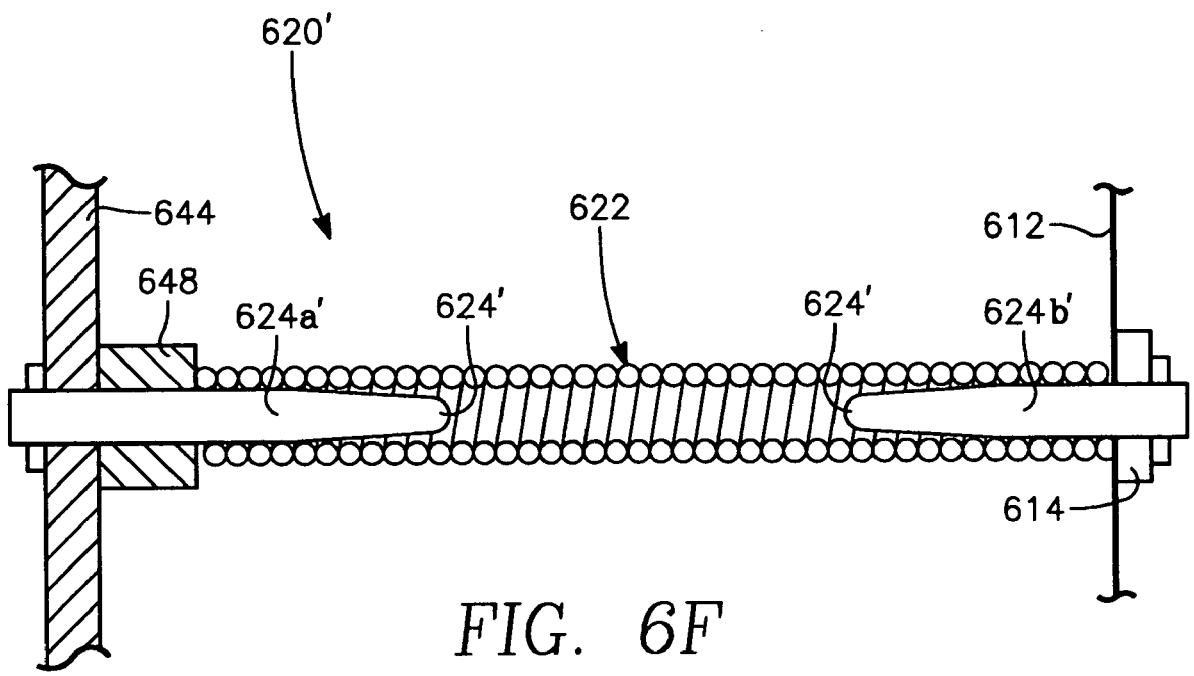

In alternate embodiments the spring rod has more than one portion or section, such as that shown in FIG. 6F. In such embodiments the spring rod 624' has a first rod section, guide rod, guide or stud 624a' and a second rod section, guide rod, guide or stud 624b' positioned at opposing ends of the spring 622. The first rod section 624a' is mounted to the spring mount 648 and extends towards the center of the spring 622. The second rod section 624b' is likewise mounted to the spring mount 614 and extends towards the center of the spring 622. The first rod section 624a' and the second rod section 624b' function to retain and guide the spring 622, such that the spring 622 will not depart from the spring assembly 620', excessively deform outward, bend and/or bind. The size and shape of the rod sections can vary depending on the particular application, for example (as shown) the rod sections can be tapered to facilitate guiding the spring 622. In other embodiments the spring 622 can be retained and guided by other structures including a counter-bore about the ends of the spring 622 at the spring mount 614 and the spring mount 648. Likewise, the spring 622 can be mounted in place by an adhesive, weld, solder, pin, screw, integration into the structure of the mount, and/or any similar mounting.

The spring rod 624 or 624' can be any of various suitable materials including a metal such as aluminum or stainless steel, and plastic.

Returning to the embodiments of FIG. 6A-E, the first rod fastener 626 and the second rod fastener 628 can each be of any of a variety of different components or structures which restrict movement of the spring rod 624. Examples include bolts, pins, caps, formed or bent portions of the spring rod 624, elements integrated into the rod 624, or the like. In some embodiments, the first rod fastener 626 and/or the first rod end 625 of the spring rod 624 can also be an alignment pin for guiding the connector head 610 into the DIB 660. Alternatively, an alignment pin can be mounted on either the first rod fastener 626 and/or the first rod end 625. In other embodiments, the first rod fastener 626 and/or the first rod end 625 can be formed to be a guiding or attachment structure, including forming a counterbore, opening or other shape(s) to receive a structure projecting from the DIB 660.

The cable assemblies 630 are positioned between the connector head 610 and the instrument board 640, and allow the connector head 610 to be positioned relative to the instrument card 640. As such, the connector head 610 can be accurately set in a specific initial position which aids in the mating with the DIB 660. Being able to provide a specific initial position, that is repeatable over many mating cycles, allows the size of receiving structures, such as the funnel 660, to be reduced. In turn, reducing the size of the receiving structures allows closer spacing, and a greater density, of the interface assemblies 600 on the instrument card 640. Having more interface assemblies 600 in a given space allows more test channels, which can be an important factor given the increased number of channels required by current semiconductor test equipment.

In the embodiment shown in FIGS. 6A-E, the interface assembly 600 has four cable assemblies 630 positioned between and about the connector head 610 and the instrument card 640. As described in detail herein, in other embodiments additional or fewer cable assemblies 630 can be used, also the position of the cable assemblies can vary.

By adjusting the length of the cable assemblies 630, the position of the connector head 610 can be changed. For example, by shortening all of the cable assemblies 630, the connector head 610 can be moved a direction along the z-axis, or by shortening the cable assemblies on one side of the connector head 610, and lengthening those on the other side, the connector head 610 can be yawed. Depending on the embodiment, one, all or some of the cable assemblies 630 can have an adjustable length.

Depending on the embodiment, the cable assemblies 630 can be positioned so they are aligned, or parallel, to one another, i.e. along the z-axis direction. Alternatively, the cable assemblies 630 can, as shown, be arranged in an offset or non-parallel manner. Having the cable assemblies 630 positioned in a parallel manner allows the cable assemblies 630 to apply a force component to the connector head 610 in a direction along the direction of the z-axis. However, having the cable assemblies 630 positioned in an offset manner allows the application of components of the force along the direction of the z-axis and lateral to the direction of the z-axis. Such lateral force components can not only act to stabilize, by urging the connector head 610 towards an initial position, but also be used to position the connector head 610.

In conjunction with the spring assemblies 620, the cable assemblies 630 can allow a preload to be applied to the interface assembly 600. Limiting movement of the connector head 610 by the cable assemblies 630, allows the spring assemblies 620 to apply a force onto the connector head 610 while in its initial position.

With embodiments such as those shown in FIGS. 6A-E, the cable assemblies 630 are tension elements, and do not carry more than limited or minor compression loads, if any compression load at all. As such, as the interface assembly is compressed, which can be a result of contact with the DIB 660 as shown in FIG. 6E, the cable assemblies are unloaded and eventually may become slack. This allows a transition of the loading from the cable assemblies 630 to the DIB 660 and/or the spring assemblies 620. As such, as the interface assembly 600 is received by the DIB 660 and compressed, the forces exerted by the cable assemblies can be replaced by forces exerted by the DIB 660. This allows positioning of the connector head 610 to transfer from being influenced by the cable assemblies 630 to being influenced by the funnel or DIB 660. The interface assembly 600 can be compressed to a point that some or all of the cable assemblies become slack and exert little or no force on the connector head 610. This process is reversed as the interface assembly 600 is uncompressed and the load transfers back to the cable assemblies 630. The connector head 610 can then return to its initial position when it is removed from the funnel 660.

As shown in the embodiments of FIGS. 6A-E, the cable assembly 630 includes a cable 632, a card mount 634, and a connector mount 636.

The cable 632 is capable of carrying tension loads between the instrument card 640 and the connector head 610. The cable 632 can be any of a variety of materials including a metal, such as aluminum, steel, stainless steel, a plastic, an organic material, or other similar suitable material. In some embodiments, the cable 632 includes a means for adjusting its length. For example, the cable 632 could include a turnbuckle (not shown) or similar device.

The card mount 634 is positioned at the instrument card 640 and attaches the cable 632 thereto. As shown, the card mount 634 can be positioned such that it is offset from the connector mount 636, such that it is not in alignment with the connector mount 636 along the z-axis. The card mount 634 can include any of a variety of different fasteners such as a hole through the instrument card 640, a catch, a loop, a hook, a weld, a solder point, an adhesive point, a screw, a bolt and/or the like. The card mount 634 can be positioned on the instrument card 640, the cable 632, or with a portion on both.

In some embodiments, the card mount 634 can include an adjuster 635 for setting the tension on, and/or the length of, the cable assembly 630. The adjuster 635 can be any of a variety of configurations including a screw, a turn buckle, a clamp, a set screw, a slider and/or the like. The adjuster 635 can be positioned on either, or both, of the instrument board 640, and the cable 632.

The connector mount 636 is positioned at the connector head 610 and attaches the cable 632 thereto. As shown, the connector mount 636 can be positioned such that it is offset from the card mount 634. The connector mount 636 can include any of a variety of different fasteners such as a hole through the connector head 610, a catch, a loop, a hook, a weld, a solder point, an adhesive point, a screw, a bolt and/or the like. The connector mount 636 can be positioned on the connector head 610, the cable 632, or with a portion on both.

In some embodiments, the connector mount 636 can include an adjustment means or device (not shown) for setting the tension on, and/or the length of, the cable assembly 630. The adjustment means can be any of a variety of configurations including a screw, a turn buckle, a clamp, a set screw, a slider and/or the like. The adjustment means can be positioned on either or both of the connector head 610, and the cable 632.

In some embodiments, the cable assembly 630 can be replaced by a beam, other substantially non-deformable structure, or a series of such structures. These embodiments can include a slider, pivot, telescoping structure, and/or similar device, to limit motion of the connector head 610. The device also should have its motion limiting influence on the connector head 610 be reduced, or eliminated, as the connector head 610 is moved from its initial position. Examples of such embodiments can include a series of telescoping tubes, a chain linkage, a beam capable of passing through the card 640 with stop collars or other slider with a limiter, and the like.

As part of the test head, the instrument card 640 can have mounted to it instruments or equipment (not shown), such as a set of test devices and/or microchips, for performing tests and analysis of the DUT. These test devices can be connected to the DIB 660 by the communication lines 650 in a direct connection. The instrument card 640 also mounts the spring assemblies 620 and the cable assemblies 630.

In the embodiment shown, the instrument card 640 includes a card 642, a mount structure 644, cable mounts 646 and spring mounts 648. The test devices (not shown) can be mounted to the card 642, as noted herein. The cable mounts 646 are positioned at each of the cable assemblies 630, and can be any of a variety of different fasteners such as a hole through the a mount structure 644, a catch, a loop, a hook, a weld, a solder point, an adhesive point, a screw, a bolt and/or the like. In some embodiments, the cable mounts 646 can include an adjustment means or device (not shown) for setting the tension, length or position of the cable assemblies 630. The adjustment means can be any of a variety of configurations including a screw, a turn buckle, a clamp, a set screw, a slider and/or the like. The adjustment means can be positioned on either or both of the mount structure 644, and the cable 632. The spring mounts 648 are positioned at each of the spring assemblies 620, and can be any of a variety of different fasteners such as a hole through the a mount structure 644, a catch, a loop, a hook, a weld, a solder point, an adhesive point, a screw, a bolt and/or the like. In some embodiments, the spring mounts 648 can include an adjustment means or device (not shown) for setting the tension, length or position of the spring assemblies 620. The adjustment means can be any of a variety of configurations including a screw, a turn buckle, a clamp, a set screw, a slider and/or the like. The adjustment means can be positioned on either or both of the mount structure 644, and the spring assemblies 620.

In the embodiment shown, the communication lines 650 carry electrical signals between the instrument card 640 and the connector head 610. The lines 650 are attached to the connector 618 to carry signals to and from the DIB 660 and the DUT. The lines 650 are positioned in a loose manner so that they can move with the connector head 610, without substantially restraining, restricting or otherwise limiting, the motion of the connector head 610. The communication lines 650 can be any of a variety of cables, such as a coaxial cable, wires, fibers, or the like, which provide for the transmission of signals. In some embodiments the lines 650 can be tubes, or other passages, for the transport of fluids and/or gases.

Figure 7:
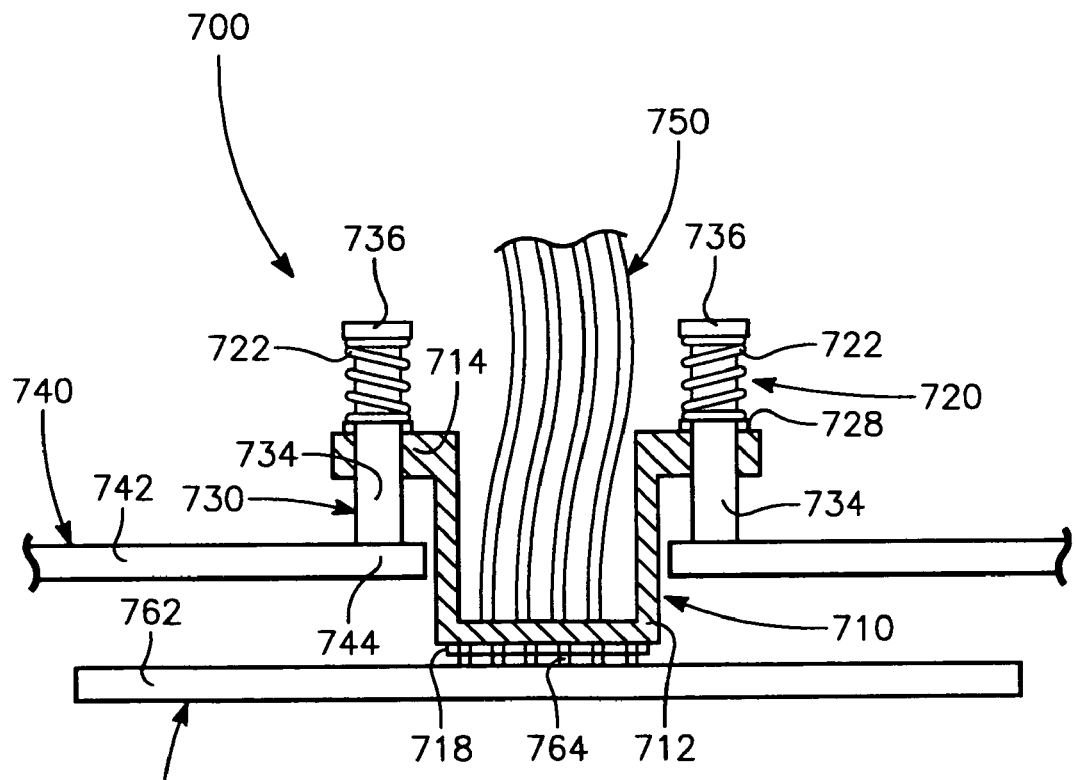
FIG. 7 shows a side view illustrating a simplified diagram of one possible embodiment.

Other embodiments of the present invention are set forth in FIG. 7. As shown, in at least one embodiment, an interface assembly 700 is capable of mating with a peripheral 760 to form a series of signal channels. The interface assembly 700 includes a connector head 710, restorative members 720, positioning members 730, a base 740, communication lines 750 and the peripheral or receptor 760.

The connector head 710 can include a frame 712, mounts 714 and a connector 718. The mounts 714 receive the restorative members 720 and the positioning members 730. The connector 718 can be a short stroke interposer, a spring pin array or any other of the connectors as set forth in other embodiments herein.

In the embodiment shown, the restorative members 720 include a set of springs 722 located between the base 740 and the positioning members 730. The restorative members 720 can also include bushings or bearings 728 for free movement of the components of the restorative members 720 and the positioning members 730.

The positioning members 730 include a set of rods or pins 734 set between the base 740 and the connector head 710, in the embodiment shown. Each of the pins 734 can be a shoulder screw, a shaft with a collar, or the like. The pins 734 are capable of limiting the motion of the connector head to one degree of freedom. Each pin 734 has a head, shoulder or collar 736 for retaining the springs 722 in position. The pins 734 are received by the mounts 714 and are attached to base 740 at the mounts 744.

The base 740 can include a card 742. The communication lines 750 can be electrical cables or any other lines as set forth in other embodiments of the present invention. The receptor 760 includes a DIB or PCB 762 and a series of pads 764. In at least one embodiment the pads are positioned to receive the pins of the connector 718.

In alternate embodiments to those set forth herein, the restorative member(s) can be any of a variety of structures that provide a biasing force when the interface assembly is displaced from its initial position. Such structures can include compression springs, tension springs, flexures, weighted masses, weights, masses, loads, pressurized cylinders, deformable structures, gas springs, air springs, air pistons, dampers, hydraulic devices, deadweights, fixed pressure sources, constant force springs and the like. Likewise, the positioning member(s) can be any of a variety of structures. For example, in certain embodiments of the interface assembly, the restorative member is a spring in tension and the positioning member is a set of one or more rigid or non-compressible structures which maintain the spring in tension. Such rigid positioning structures could include rod(s) which position the assembly at an initial position, but are mounted to allow displacement from the initial position. Of course, other similar such arrangements and configurations of the interface assembly are within other embodiments of the invention.

Having described this invention in connection with a number of embodiments, modification will now certainly suggest itself to those skilled in the art. As such, the invention is not to be limited to the disclosed embodiments except as required by the appended claims.

What is claimed is:

1. An interface assembly comprising:
    a) a connector adapted to mate with a receptor;
    b) a base;
    c) a biasing member coupling the base and the connector so as to bias the connector away from the base in a connection direction along which the connector and the receptor mate along a z-axis orthogonal to the receptor; and
    d) a non-rigid limiter separate from the biasing member, wherein the non-rigid limiter couples the base and the connector, wherein the non-rigid limiter prevents the connector from separating from the base beyond a length of the non-rigid limiter.

2. The interface assembly of claim 1, wherein the non-rigid limiter is capable of limiting motion of the connector in at least one degree of freedom.

3. The interface assembly of claim 1, wherein the non-rigid limiter is capable of limiting motion of the connector in at least two degrees of freedom.

4. The interface assembly of claim 1, wherein the non-rigid limiter is capable of limiting motion of the connector in at least three degrees of freedom.

5. The interface assembly of claim 1, wherein the non-rigid limiter is capable of limiting motion of the connector in at least four degrees of freedom.

6. The interface assembly of claim 1, wherein the non-rigid limiter is capable of limiting motion of the connector in six degrees of freedom.

7. The interface assembly of claim 1, wherein the biasing member directly couples the base and the connector.

8. An interface assembly comprising:
a) a connector adapted to mate with a receptor;
b) a base;
c) a biasing member mounted between the base and the connector so as to bias the connector away from the base in a connection direction along which the connector and the receptor mate along a z-axis orthogonal to the receptor; and
d) a non-rigid limiter mounted between the base and the connector, wherein the non-rigid limiter is separate from the biasing member, and wherein the non-rigid limiter is positioned lateral to the biasing member, wherein the non-rigid limiter prevents the connector from separating from the base beyond a length of the non-rigid limiter.

9. The interface assembly of claim 8, wherein the biasing member is positioned about the non-rigid limiter.

10. The interface assembly of claim 8, wherein the non-rigid limiter is positioned about the biasing member.

11. The interface assembly of claim 8, wherein the biasing member comprises at least two deformable members opposingly mounted about the connector, and wherein the non-rigid limiter comprises members positioned lateral to the at least two deformable members.

12. A floating interface assembly comprising:
a) a connector having an initial position, the connector being adapted to mate with a receptor;
b) a base;
c) a restorative member mounted between the base and the connector, wherein upon displacement of the connector from the initial position, the restorative member exerts a biasing force to urge the connector towards the initial position in a connection direction along which the connector and the receptor mate along a z-axis orthogonal to the receptor; and
d) a non-rigid positioning member mounted between the base and the connector, wherein the non-rigid positioning member is constructed to limit motion of the connector in at least one degree of freedom, wherein the non-rigid positioning member prevents the connector from separating from the base beyond a length of the non-rigid positioning member.

13. The floating interface assembly of claim 12, wherein the positioning member comprises at least one of: (1) a cable; (2) a chain; (3) a telescoping assembly.

14. The floating interface assembly of claim 12, wherein the positioning member comprises a cable.

15. The floating interface assembly of claim 12, wherein restorative member comprises at least one of: (1) a spring; (2) a flexure; (3) a deformable structure.

16. The floating interface assembly of claim 12, wherein restorative member comprises a spring.

17. The floating interface assembly of claim 16, wherein the positioning member comprises a cable.

18. The floating interface assembly of claim 12, wherein the positioning member is capable of limiting motion of the connector in at least two degrees of freedom.

19. The floating interface assembly of claim 12, wherein the positioning member is capable of limiting motion of the connector in at least three degrees of freedom.

20. The floating interface assembly of claim 12, wherein the positioning member is capable of limiting motion of the connector in at least four degrees of freedom.

21. The floating interface assembly of claim 12, wherein the positioning member is capable of limiting motion of the connector in six degrees of freedom.

22. The floating interface assembly of claim 12, wherein the connector comprises a deformable member having a connector spring constant, wherein the restorative member has a restorative member spring constant, and wherein the connector spring constant is greater than the restorative member spring constant.

23. The floating interface assembly of claim 12, wherein the connector is a double-sided electrical connector having an array of spring pins.

24. The floating interface assembly of claim 12, wherein the connector comprises at least one of: (1) an electrical connector; (2) a fluid connector; or (3) an optical connector.

25. A test platform comprising a floating interface assembly capable of mating with a peripheral to form a series of signal channels, the floating interface assembly comprising:
a) an electrical connector capable of connecting with the peripheral;
b) a base;
c) an electrical conductor extending between the electrical connector and the base;
d) a spring assembly coupling the base and the electrical connector, wherein the spring assembly is deformable, such that the electrical connector is capable of motion in six degrees of freedom relative to the base; and
e) a cable assembly positioned between the base and the electrical connector, wherein the cable assembly is constructed to limit motion of the electrical connector in at least one degree of freedom, wherein the cable assembly prevents the electrical connector from separating from the base beyond a length of the cable assembly.

26. The test platform of claim 25, wherein the cable assembly comprises a cable.

27. The test platform of claim 25, wherein the cable assembly comprises two cables, wherein the two cables are capable of limiting motion of the electrical connector in at least two degrees of freedom.

28. The test platform of claim 25, wherein the cable assembly comprises three cables, wherein the three cables are capable of limiting motion of the electrical connector in at least three degrees of freedom.

29. The test platform of claim 25, wherein the cable assembly comprises four cables, wherein the four cables are capable of limiting motion of the electrical connector in at least four degrees of freedom.

30. The test platform of claim 25, wherein the cable assembly comprises six cables, wherein the six cables are capable of limiting motion of the electrical connector in six degrees of freedom.

31. The test platform of claim 25, wherein the electrical connector comprises a deformable member having an electrical connector spring constant, wherein the spring assembly has a spring assembly spring constant, and wherein the electrical connector spring constant is greater than the spring assembly spring constant.

32. The test platform of claim 25, further comprising at least one communication line electrically connected to the electrical connector.

33. The test platform of claim 25, wherein the cable assembly comprises an adjuster for defining a length of the cable assembly.

34. The test platform of claim 33, wherein the adjuster comprises a set screw.

35. The test platform of claim 25, wherein the cable assembly comprises at least two non-parallel cables.

36. The test platform of claim 25, wherein the electrical connector comprises a deformable member having an electrical connector spring constant, wherein the spring assembly has a spring assembly spring constant, and wherein a ratio of the electrical connector spring constant to the spring assembly spring constant is within a range of about 5:1 to about 300:1.

37. The test platform of claim 36, wherein the ratio of the electrical connector spring constant to the spring assembly spring constant is within a range of about 10:1 to about 50:1.

38. The test platform of claim 37, wherein the ratio of the electrical connector spring constant to the spring assembly spring constant is about 26:1.

39. The test platform of claim 25, wherein the electrical connector comprises a plurality of connector pins, wherein each connector pin of the plurality of connector pins is capable of exerting a force within a range of about 5 grams to about 70 grams.

40. The floating interface assembly of claim 25, wherein the restorative member exerts on the connector a substantially constant force provided by at least one of: (1) a deadweight; (2) a fixed pressure source; (3) a constant force spring; (4) a spring; (5) a flexure; (6) a deformable structure; (7) a gas spring; (8) an air spring; (9) an air piston; (10) a damper; (11) a hydraulic apparatus; (12) a weight; (13) a mass; or (14) a load.

41. The floating interface assembly of claim 25, wherein the connector comprises a deformable member having a connector spring constant, wherein the restorative member has a restorative member spring constant, and wherein a ratio of the connector spring constant to the restorative member spring constant is within a range of about 1:1 to about 10,000:1.

42. The floating interface assembly of claim 41, wherein the spring is located about a guide rod for positioning the spring, and wherein the guide rod is mounted to at least one of: (1) the base; or (2) the connector.

43. An interface assembly comprising:
a) a connector adapted to mate with a receptor;
b) a base;
c) a non-rigid positioning member mounted between the base and the connector,
wherein the positioning member limits motion of the connector to substantially one degree of freedom. wherein the non-rigid positioning member prevents the connector from separating from the base beyond a length of the non-rigid positioning member; and
d) a restorative member abutting the connector, wherein the restorative member is capable of exerting a biasing force on the connector away from the base in a connection direction along which the connector and receptor mate along a z-axis orthogonal to the connector and the receptor.

44. The interface assembly of claim 43, wherein the positioning member comprises a rod, and wherein the restorative member comprises a spring.

45. The interface assembly of claim 43, wherein the restorative member is a spring distributed about the positioning member and wherein the spring abuts at least one of: (1) the base; or (2) the positioning member.

* * * * *